US008500984B2

(12) United States Patent  
Egawa et al.

(10) Patent No.: US 8,500,984 B2  
(45) Date of Patent: Aug. 6, 2013

(54) METHOD FOR MANUFACTURING PRINTED-CIRCUIT BOARD

(75) Inventors: Yoshimi Egawa, Tokyo (JP); Harufumi Kobayashi, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 625 days.

(21) Appl. No.: 12/490,470

(22) Filed: Jun. 24, 2009

(65) Prior Publication Data

US 2009/0321266 A1  Dec. 31, 2009

(30) Foreign Application Priority Data

Jun. 26, 2008  (JP) .................... 2008-167152

(51) Int. Cl.
*C25D 5/02* (2006.01)
*H05K 3/02* (2006.01)
*H01K 3/10* (2006.01)

(52) U.S. Cl.
USPC ............................. 205/125; 29/847; 29/850

(58) Field of Classification Search
USPC ............................ 205/125; 29/847, 850
See application file for complete search history.

(56) References Cited

U.S. PATENT DOCUMENTS

| | | | | |
|---|---|---|---|---|
| 4,925,525 A * | 5/1990 | Oku et al. | | 216/13 |
| 6,175,151 B1 * | 1/2001 | Hashimoto | | 257/676 |
| 6,312,614 B1 * | 11/2001 | Arimitsu et al. | | 216/13 |
| 6,399,417 B1 * | 6/2002 | Lee et al. | | 438/106 |
| 6,486,052 B1 | 11/2002 | Sato | | |
| 7,213,333 B2 * | 5/2007 | Mita | | 29/847 |
| 2007/0292993 A1 * | 12/2007 | Tanoue | | 438/123 |

FOREIGN PATENT DOCUMENTS

| | | |
|---|---|---|
| JP | 01-260886 | 10/1989 |
| JP | 10-533563 | 9/1998 |
| JP | 2001068588 | 3/2001 |
| JP | 2002050715 | 2/2002 |
| JP | 2004-319578 | 11/2004 |
| JP | 2005079129 | 3/2005 |
| JP | 2007-266492 | 10/2007 |
| WO | 01/78139 A1 | 10/2001 |

OTHER PUBLICATIONS

Japanese Office Action dated May 31, 2012.

* cited by examiner

*Primary Examiner* — Keith Hendricks  
*Assistant Examiner* — Stefanie Sherrill  
(74) *Attorney, Agent, or Firm* — Volentine & Whitt, PLLC

(57) ABSTRACT

A method for manufacturing a printed circuit board having an insulative board and a plurality of electroconductive pads arranged in a grid shape on the insulative board, the method including a step for forming an electroconductive film on the insulative board; a step for forming a pattern on the electroconductive film so as to form the electroconductive pads, a lead wire connected to at least one of the electroconductive pads, and inter-pad wiring for electrically connecting each of the electroconductive pads not connected to the lead wire to any of the electroconductive pads connected to the lead wire, the inter-pad wiring being disposed between mutually adjacent electroconductive pads; a step for plating each of the electroconductive pads by immersing the insulative board in a plating bath and energizing each of the electroconductive pads through the lead wire; and a step for removing the inter-pad wiring.

11 Claims, 7 Drawing Sheets

METHOD FOR MANUFACTURING PRINTED-CIRCUIT BOARD

BACKGROUND OF THE INVENTION

1. Technical field

The present invention relates to a method for manufacturing a printed circuit board for mounting a semiconductor device and other electronic components.

2. Description of the Related Art

There are known in the art plastic packages in which ICs, LSIs, or other semiconductor chips are mounted on a printed circuit board, and a resin is injected into the chip mounting section to seal the package. A BGA (ball grid array) configuration is commonly used for such plastic packages in order to provide a larger number of terminals for the semiconductor chips to be mounted and to reduce the size of the package.

A plurality of bonding pads, conductive wires, and the like are formed on the obverse surface of printed circuit boards used in BGA-type plastic packages, while a plurality of solder ball pads for forming solder balls as external connection terminals is formed in a grid shape on the reverse surface. Each of the solder ball pads is electrically connected to conductive wiring that includes bonding pads formed on the surface of the board via through-holes formed in the printed circuit board. It is thereby possible for I/O signals to be routed from external connection terminals on the reverse surface of the printed circuit board. The bonding pads and the solder ball pads are ordinarily plated with Au in order to ensure the solder balls and the bonding wires are joined with adequate strength.

FIG. 1 is a plan view schematically showing the configuration of a conventional printed circuit board 100, the configuration being on the reverse side of the board, which is the side opposite from the chip-mounting surface. A plating tie bar 110 (tie bar for plating) is formed on base material 200 so as to surround the periphery of the printed circuit board 100. A plurality of plating lead wires 120 (lead wire for plating) that extend toward through-holes 130 and the solder ball pads 140 from the tie bar 110 are formed. The plating lead wires 120 are independently provided to each of the through-holes 130 and solder ball pads 140. For this reason, the plating lead wires 120 connected to the solder ball pads 140 positioned in the center portion of the plastic board are arranged so as to weave between other solder ball pads and plating lead wires. The Au-plating process used on the solder ball pads 140 is carried out by electroplating, wherein each of the solder ball pads is energized via the plating lead wires 120 and the plating tie bar 110 in the plating bath. The base material 200 is cut along a cut line 300, whereby the printed circuit board 100 is formed into smaller pieces.

SUMMARY OF THE INVENTION

As the number of functions of a semiconductor chips increases and the size of packages is further reduced, it is conceivable that the number of bonding pads and solder ball pads will increase, and the density of the wiring pattern on the printed circuit board will become further high. When this happens, the number of plating lead wires will also increase as the number of pads increases in a configuration in which plating lead wires are provided to each of the solder ball pads, as shown in FIG. 1, and it is difficult to provide adequate space in which the plating lead wires can be arranged. As is particularly so with a configuration in which a plating tie bar is present in the peripheral region of the board, all of the plating lead wires must be drawn out toward the plating tie bar. Therefore, the plating lead wires converge in the vicinity of the periphery of the board, the wires are less readily arranged between the pads, and the package size must be increased.

The plating lead wires are required entirely for carrying out the plating process and do not contribute to any of the intrinsic functions of the product; nevertheless, they remain on the board even in the completed product. This wiring can be redundant wiring connected to the I/O signal terminals, and is liable to cause various problems in terms of the operation of the semiconductor device. For example, the redundant wiring may act as an antenna, whereby noise gets mixed with the I/O signals or signal interference may occur between adjacent wires. There is also a possibility that the wiring capacitance of the plating lead wires will increase and cause a delay in the I/O signals.

Japanese Laid-open Patent Application No. 2005-79129 discloses a configuration in which connection wires connected via a tie bar for plating and lead wires are provided to an open space in the center portion of the board where no pads are formed, and pads that are to be plated are connected to the connection wires. Since the pads facing the connection wires will be energized via the connection wires, the lead wires are thereby not required to be drawn out toward the tie bar for plating formed on the periphery of the board. As a result, the density of the lead wires in the outer vicinity of the board can be reduced. However, in such a configuration, only the lead wires of some of the pads facing the connection wires in the center part of the board can be eliminated. Therefore, the wiring density in the outer vicinity of the board increases when the number of pads is further increased, leaving the problem fundamentally unresolved.

There is also proposed in Japanese Laid-open Patent Application No. 2001-68588 a printed circuit board configuration based on the same concept used in Japanese Laid-open Patent Application No. 2005-79129; however, in this configuration as well, the problems of an increase in the number of lead wires as the number of pads increases and redundant wiring are not readily solved.

The present invention was contrived in view of the foregoing points and it is an object thereof to provide a method for manufacturing a printed circuit board that can reduce the number of plating lead wires that are used for electroplating pads on a printed circuit board in which a plurality of pads are arranged in the form of a grid, and that can prevent the plating lead wires from becoming redundant and having a negative effect on the electrical characteristics of the completed product.

The method for manufacturing a printed circuit board according to the present invention is a method for manufacturing a printed circuit board having an insulative board and a plurality of electroconductive pads arranged in a grid shape on said insulative board, the method comprising: a step for forming an electroconductive film on said insulative board; a step for forming a pattern on said electroconductive film so as to form said electroconductive pads, a lead wire connected to at least one of said electroconductive pads, and inter-pad wiring for electrically connecting each of the electroconductive pads not connected to said lead wire to any of the electroconductive pads connected to said lead wire, said inter-pad wiring being disposed between mutually adjacent electroconductive pads; a step for plating each of said electroconductive pads by immersing said insulative board in a plating bath and energizing each of said electroconductive pads through said lead wire; and a step for removing said inter-pad wiring.

The method for plating a printed circuit board according to the present invention is a method for plating a printed circuit board having an insulative board and a plurality of electroconductive pads arranged in a grid shape on said insulative board, in which each of said electroconductive pads of the printed circuit board undergoes a plating process, the method comprising: a step for forming said electroconductive pads on said insulative board, a lead wire connected to at least one of said electroconductive pads, and inter-pad wiring for electrically connecting each of the electroconductive pads not connected to said lead wire to any of the electroconductive pads connected to said lead wire, said inter-pad wiring being disposed between mutually adjacent electroconductive pads; a step for plating each of said electroconductive pads by immersing said insulative board in a plating bath and energizing each of said electroconductive pads through said lead wire; and a step for removing said inter-pad wiring.

The method for manufacturing a semiconductor package according to the present invention is a method for manufacturing a semiconductor package having a printed circuit board that includes an insulative board and a plurality of electroconductive pads arranged in a grid shape on said insulative board, and a semiconductor device mounted on said printed circuit board, the method comprising: a step for forming an electroconductive film on said insulative board; a step for forming a pattern on said electroconductive film so as to form said electroconductive pads, a lead wire connected to at least one of said electroconductive pads, and inter-pad wiring for electrically connecting each of the electroconductive pads not connected to the lead wire to any of the electroconductive pads connected to said lead wire, said inter-pad wiring being disposed between mutually adjacent electroconductive pads; a step for plating each of said electroconductive pads by immersing said insulative board in a plating bath and energizing each of said electroconductive pads through said lead wire; a step for removing said inter-pad wiring; and a step for mounting said semiconductor device on said printed circuit board and electrically connecting external connection terminals of said semiconductor device to each of said electroconductive pads.

According to the method for manufacturing a printed circuit board of the present invention, wiring is formed between mutually adjacent pads, whereby each of the pads not connected to a plating lead wire is electrically connected to any of the pads connected to the plating lead wire. Therefore, a plating lead wire is not required to be provided to each pad, and the number of plating lead wires can be considerably reduced. It is accordingly possible to solve the problem in which adequate space for arranging the plating lead wires cannot be provided because of an increased wiring density in the vicinity of the periphery of the board, even when the number of pads is increased.

Furthermore, according to the method for manufacturing a printed circuit board of the present invention, since the number of plating lead wires can be considerably reduced, it is possible to solve the conventional problem in which the plating lead wires become redundant and have a negative effect on the characteristics of the product. In particular, since the inter-pad wiring provided between the pads will be subsequently removed by etching, redundant wiring can be substantially completely eliminated.

DETAILED DESCRIPTION OF THE INVENTION

A preferred embodiment of the present invention is described below with reference to the attached drawings. FIG. 2 is a plan view showing the configuration of the obverse surface of the printed circuit board 10 according to an embodiment of the present invention. FIG. 3 is a plan view showing the configuration of the reverse surface according to an embodiment of the present invention. The drawings show a state prior to an Au plating process to be carried out on a variety of pads.

The printed circuit board 10 may be made of a glass epoxy resin, a paper phenolic resin, a paper epoxy resin, or the like. A chip mounting area 20 in which IC chips are to be mounted and a BGA mounting area 30 in which a BGA package is to be mounted are provided on the obverse surface of the printed circuit board 10. A die pad 21 is provided in the chip mounting area 20, and an IC chip is soldered or otherwise mounted on the die pad 21. The IC chips mounted on the printed circuit board 10 are connected to bonding pads 22 by bonding wires, and conductive wiring 40 or the like is used for establishing circuit connections with other components. A plurality of land pads 31 that correspond to each of the solder balls of the BGA package to be mounted are arranged on the grid in the BGA mounting area 30. A land pad is a pad connected to a solder ball constituting the external connection terminal of the BGA package.

The land pads 31 are electrically connected to the IC chips by conductive wiring 40 or the like. The 15×15 array of land pads 31 is formed in the BGA mounting area 30 on the printed circuit board 10. The IC chip, the BGA, and a plurality of other electronic components are thus mounted on the printed circuit board 10, and conductive wiring 40 or the like formed on the printed circuit board 10 is used to establish circuit connections between these components, whereby they are integrated into a single function module.

The printed circuit board 10 is cut along a cut line 90 in the final step, whereby individual pieces are obtained as single product portions. A plating tie bar 50 (tie bar for plating) is formed on the base material before the board is cut into individual pieces in such a way as to surround the periphery of the product portion. Plating leads 51 (lead for plating) extend from the plating tie bar 50 toward the die pad 21 inside the chip mounting area 20 and the land pads 31 inside the BGA mounting area 30. Au-plating is applied to the land pads 31, the die pad 21, and the bonding pads 22 in order to ensure adequate joining strength between the solder balls and the bonding wire. The plating process used on the variety of pads is carried out by immersing the printed circuit board 10 in a plating bath and energizing the pads via the plating tie bar 50 and the plating leads 51. In the printed circuit board 10 of the present embodiment, the plating leads 51 are connected only to specific pads positioned at the outermost of the plurality of land pads arranged in the shape of grid, which is different from a conventional configuration in which a lead wire is provided to each pad. It is apparent that the number of plating lead wires is thereby smaller even though the number of pads is considerably higher, in comparison to the conventional configuration shown in FIG. 1. The die pad 21 and the bonding pads 22 are connected to the plating tie bar 50 via the plating leads 51 and conductive wiring formed on the printed circuit board.

FIG. 4 is an enlarged view of the section A surrounded by the broken line in FIG. 2. The plating leads 51 connected to the plating tie bar 50 are connected to a land pad 31a positioned in the outermost of the plurality of land pads. An inter-pad wiring 52 that branches in three directions is provided to the land pad 31a. Land pads 31b, 31c, and 31d connected to the inter-pad wiring 52 are electrically connected to the land pad 31a to which the plating lead 51 are connected. Similarly, an inter-pad wiring that branches in three directions and an inter-pad wiring extending toward the adjacent land pad 31e are provided to the land pad 31d. The land pads 31e, 31f, 31g connected to these inter-pad wirings are electrically connected to the land pad 31d. The land pad 31*h* and 31*i* are likewise electrically connected by the inter-pad wiring that extends from the land pad 31*h*. All of the land pads 31*a* to 31*i* shown in FIG. 4 are thus electrically connected to each other by the inter-pad wiring 52 provided between mutually adjacent land pads. Therefore, by energizing the plating lead 51 connected only to the land pad 31*a* of the outermost of the plurality of land pads, the other land pads 31*b* to 31*i* to which the plating lead wires 51 are not connected will also be energized. In other words, adopting the above configuration makes it possible to energize land pads positioned at the inner part without having to provide a plating lead wire to each land pad, and these pads can be electroplated.

The plating leads 51 are arranged at substantially equidistant intervals in the elongation direction of the plating tie bar 50 and are connected to a specific land pad 31 positioned at the outermost of the plurality of land pads, as shown in FIG. 2. The other land pads to which a plating lead 51 is not connected are electrically connected to any of the land pads connected to the plating lead 51 by the inter-pad wiring 52. It is thereby possible to energize all of the land pads arranged in a grid shape via the plating tie bar 50, the plating lead 51, and the inter-pad wiring 52. All of these land pads may be subjected to the plating process.

As shown in FIG. 4, the inter-pad wiring 52 is further characterized in being arranged so that connections are established between land pads that are diagonally adjacent with respect to the directions that run vertically and horizontally in the drawing (i.e., the directions in which the land pads are arranged) but connections are not established between land pads that are adjacent in the directions in which the land pads are arranged. The inter-pad wiring 52 is further characterized in that branching points 53 of the inter-pad wiring are provided so as to be concentrated in intermediate points between land pads that are adjacent in the diagonal direction. This configuration shall be described below in further detail.

FIG. 5A is an enlarged view of the land pads 31, and FIG. 5B is a cross-sectional view along line X-X in FIG. 5A. Through-holes 32 are provided in the respective vicinities of the land pads 31. The through-holes 32 are composed of a open hole 32*a* formed through the printed circuit board 10 and a Cu film 32*b* for covering the inner wall of the open hole 32*a*. The land pads 31 are electrically connected via the through-holes 32 to each of the solder ball pads 34 provided to the reverse side of the printed circuit board 10.

A solder ball pad 33 is used to form a solder ball for use as an external connection terminal. As shall be apparent from FIGS. 3 and 5B, the solder ball pad 33 is formed in a solder ball formation area 35 which is symmetrical to BGA mounting area 30 across the base material of the printed circuit board 10. The solder ball pads 33 have corresponding land pads 31, and are formed in positions where they will be symmetrical to the land pads 31 across the base material. Therefore, the solder ball pads are arranged in a 15×15 configuration, in the same manner as the land pads 31.

The solder ball pads 33 are subjected to a plating process in order to ensure they can bond to the solder balls with adequate strength, but inter-pad wiring and lead wires for carrying out the plating process are substantially not provided to the solder ball pads 33 on the reverse side of the printed circuit board 10, as shown in FIG. 2. This is due to the fact that the solder ball pads 33 are electrically connected to the land pads 31 on the obverse surface of the printed circuit board 10 via the through-holes 32, so that the corresponding land pads 31 are energized, and thereby the solder ball pads 33 on the reverse surface are also energized.

As shown in section B surrounded by the broken line in FIG. 3, the reverse surface also has a region in which the inter-pad wiring 52 is formed. In this way, in case in which wiring must be disposed between the land pads on the obverse surface so inter-pad wiring 52 cannot be disposed on the obverse surface, inter-pad wiring 52 is formed on the reverse surface so that land pads can be energized via solder ball pads. In other words, the inter-pad wiring 52 on the reverse surface of the printed circuit board 10 is provided for the purpose of complementing the inter-pad wiring 52 on the obverse surface. Therefore, it is possible to form circuit-connecting conductive wiring in high densities between the solder ball pads because the amount of inter-pad wiring provided on the reverse surface is less than that of inter-pad wiring provided on the obverse surface. In the present embodiment, inter-pad wiring 52 is disposed in higher densities on the obverse surface of the board, but may be formed so as to be present in greater density on the reverse surface, or to be in the same density on the top surface and the reverse surface.

A dummy pattern 60 that does not contribute to the intrinsic function of the completed product is provided on the reverse surface of the printed circuit board 10 in an area in which conductive wiring and a variety of pads are not formed. The dummy pattern is provided in order to prevent warping that can occur in the printed circuit board 10 due to differences in pattern density on the board. Differences in pattern density may be caused when the density of the inter-pad wiring 52 extending in the vicinity of the periphery of the printed circuit board 10 is reduced by the effect of the present embodiment. The dummy pattern 60 is formed from the same Cu film used in a variety of wires formed on the printed circuit board 10, or from another material. The dummy pattern 60 is arranged so as to fill the open spaces on the printed circuit board 10 and form a uniform pattern density overall.

A solder ball formation area 23 is provided on the backside of the chip mounting area 20, and a plurality of solder ball pads 24 for mounting solder balls is formed in the solder ball formation area 23. The solder ball pads 24 also undergo plating process. The solder ball pads 24 are electrically connected to the die pad 21 of the obverse surface of the board via through-holes 25. The die pad 21 can be energized via the plating leads 51 and the plating tie bar 50, whereby the solder ball pads 24 will be able to be electroplated.

There follows a description of a method for manufacturing a printed circuit board 10 having the configuration described above. First, a glass epoxy resin board used as the base material of the printed circuit board 10 is prepared. The glass epoxy resin board is formed by impregnating a layered glass cloth with epoxy resin. A copper foil is affixed to the obverse and reverse surfaces of the resin board. In addition to a resin board, it is also possible to use a ceramic board, a glass board, or another insulative board as the base material of the printed circuit board. Holes constituting through-holes are then formed by NC machining on the basis of drill data generated when the wiring pattern is designed. A Cu film is subsequently formed by electroless plating on the obverse and reverse surfaces of the base material as well as on the inner wall of the through-holes. Hereby an electroconductivity is given the inner wall of the through-holes, and establishes an electrical connection between the obverse and reverse surfaces of the board. A thick Cu film is thereafter formed by electroplating. Next, a dry photosensitive film is affixed to the obverse and reverse surfaces of the resin board on which the Cu film has been formed. A negative film to which the shape of the wiring pattern has been transferred is bonded fast to the board to which the dry film is affixed, and the dry film is exposed to UV. The exposed portions of the dry film through the negative film are thereby cured. The dry film in the unexposed portions is subsequently removed so that the Cu film on the surface of the board is partially exposed. Next, the Cu film in the exposed portions is etched and a conductive pattern is formed on the obverse and reverse surfaces of the board. Pads, the inter-pad wiring 52, the plating leads 51, the plating tie bar 50, and other types of conductive wiring are variously formed on the obverse and reverse surfaces of the resin board via the steps described above to obtain the printed circuit board 10 shown in FIGS. 2 and 3.

FIGS. 6A-6H show the process steps carried out after the steps described above have been completed. FIG. 6A is a plan view showing a portion of the printed circuit board 10 in a state in which the conductive pattern has been completely formed via the steps described above. FIGS. 6B-6E show the processes carried out after the steps described above have been carried out, the views being cross-sections taken along line Y-Y in FIG. 6A. FIG. 6F is a top view of the portion after the printed circuit board 10 has been completed. FIGS. 6A-6F show three land pads adjacent in the diagonal direction with respect to the directions in which the land pads 31 are arranged; e.g., as shown by dashed-line section C shown in FIG. 4.

After the conductive pattern is formed on the printed circuit board 10, a solder resist 70 is formed on the board. The solder resist 70 may be a liquid solder resist formed by dissolving a resist resin in a solvent, or a dry-film-type solder resist worked into the form of a film. Apertures 71 are subsequently formed in the solder resist 70 via exposure and development processes, and a predetermined region including the land pads 31 and the branching points 53 of the inter-pad wiring 52 is exposed (FIG. 6B). The apertures 71 of the solder resist are shown by the broken line in FIG. 6A.

A photoresist 72 is then formed on the printed circuit board 10 on which the solder resist 70 has been formed, and exposure and development processes are followed to form apertures 73 in the area in which the land pads 31 are formed. The land pads 31 are thereby exposed via the apertures in the photoresist 72 and the solder resist 70 (FIG. 6C).

The printed circuit board 10 is then immersed in an Au-plating bath to form an Au-plating film 80 on the land pads 31 exposed via the apertures 73 of the photoresist. The Au plating is carried out by energizing the land pads 31 to be plated in the bath. In other words, the negative electrode of a power source is connected to the plating tie bar 50, and the land pads 31 are energized via the plating tie bar 50, the plating leads 51, and the inter-pad wiring 52 (FIG. 6D). The bonding pads 22 and the solder ball pads 24 and 34 on the reverse surface of the board also undergo Au-plating using the same process, though this is not shown in the drawings. The soldering and bonding characteristics are thus improved as a result of subjecting the variety of pads to Au-plating. An Ni-plating film may be formed as an underplating before the Au-plating is performed, and a palladium-plating film may be formed in place of the Au-plating film.

The photoresist 72 is then removed and a predetermined region including the branching points 53 of the inter-pad wiring exposed through the apertures 71 of the solder resist 70 is removed by etching performed using, e.g., an aqueous solution of ferric chloride or the like. The Au-plated land pads 31 are not etched because the Au-plating acts as a mask, so that it is possible to selectively remove only the inter-pad wiring 52 composed of the Cu film (FIG. 6E). FIG. 6F is a top view of the inter-pad wiring 52 following etching. As shown in FIG. 6F, adjacent land pads can be electrically isolated by removing the inter-pad wiring 52 so as to include the branching points 53.

In the present embodiment, the inter-pad wiring 52 is arranged so as to connect the land pads adjacent in the diagonal direction with respect to the directions in which the pads are arranged; i.e., in the direction in which the separation distance is larger. Therefore, the wiring can be made longer than when the inter-pad wiring is arranged so as to connect the land pads adjacent in the direction in which the separation distance is smaller; i.e., the vertical and horizontal directions, which are the directions in which the land pads are arranged. The area of the apertures 73 of the photoresist for removing the inter-pad wiring 52 can accordingly be increased. As a result, the distance between the facing end parts of inter-pad wiring 52 devided by etching can be increased, and any risk of short-circuiting between wiring due, e.g., to foreign matter deposits can be reduced. Since the branching points 53 of the inter-pad wiring are provided so as to be concentrated at an intermediate point between the land pads that are diagonally adjacent with respect to the direction in which the pads are arranged, the four land pads surrounding a branching point 53 can be isolated merely by etching the inter-pad wiring 52 so as to include the branching point 53. Accordingly, the aperture pattern of the photoresist 72 can be simplified, so that designing the pattern is facilitated. In the present embodiment, the inter-pad wiring 52 can be removed using a fine processing technology for a semiconductor device; therefore, the inter-pad wiring 52 can be reliably and readily removed even when the land pads 31 are present in a smaller pitch. The land pads can be isolated in a single process by using a photoresist-assisted etching method to remove the inter-pad wiring 52.

After having passed through the processes described above, the completed printed circuit board 10 is cut along a cut line 90 in the final step to separate individual pieces from the plating tie bar 50 to obtain single product portions. The printed circuit board 10 is completed by undergoing the steps described above.

Thus, in a printed circuit board having a plurality of pads arranged in the shape of a grid, plating lead wires are connected to only specific pads positioned at the outermost of the plurality of land pads and inter-pad wiring is formed between mutually adjacent pads, whereby the pads not connected to the plating lead wires will be electrically connected to any of the pads connected to the plating lead wires. Therefore, a plating lead wire need not be provided to each pad. As a result, there can be far fewer plating lead wires than with a printed circuit board having a conventional configuration as shown in FIG. 1, which has a lead wire for each pad. Moreover, it will be possible to solve the problem in which, if there is a larger number of pads, the wiring density increases in the vicinity of the periphery and adequate wiring space cannot be obtained.

According to the method for manufacturing a printed circuit board of the present invention, the number of plating lead wires can be considerably reduced; therefore, it is possible to solve the conventional problem in which the plating lead wires become redundant and adversely affect the electrical characteristics of the product. In particular, redundant wiring can be almost completely eliminated because the wiring provided between the pads is subsequently removed by etching.

FIG. 7 is a schematic cross-sectional view of a semiconductor device manufactured using the printed circuit board 10. An IC chip 500 is soldered onto the die pad 21 in the IC chip mounting area 20 of the printed circuit board 10. The IC chip 500 and the printed circuit board 10 are electrically connected by wire bonding. The bonding wire 520 provides a connection between the electrode pads of the IC chip 500 and the bonding pads 22 formed on the printed circuit board 10. The IC chip 500 and the bonding wire are encased in an insulative resin 510. Solder balls 530 are formed on the backside of the IC chip mounting area 20 of the printed circuit board 10. The solder balls 530 are formed on the solder ball pads 24, which are themselves formed on the printed circuit board 10. The through-holes 25 form electric pathways for electroplating the solder ball pads 24. A BGA package 600 is mounted on the BGA mounting area 30 of the printed circuit board 10. The solder balls, which function as external connection terminals of the BGA package, are joined to the land pads 31 formed on the printed circuit board 10. Solder balls 610 are formed on the backside of the BGA mounting area of the printed circuit board 10. The solder balls 610 are formed on the solder ball pads 33, which are themselves formed on the printed circuit board 10. The solder balls of the BGA package 600 are electrically connected to corresponding solder balls 610 on the printed circuit board via the through-holes 32. Having the BGA package 600 and the IC chip 500 mounted on the printed circuit board 10 connected to each other using conductive wiring formed on the printed circuit board 10 enables a semiconductor device 1000 having the above configuration to constitute a single function module. The semiconductor device 1000 is mounted on a motherboard, with the solder balls 530 and 610 formed on the reverse surface of the printed circuit board 10 serving as external connection terminals.

BRIEF DESCRIPTION OF THE DRAWINGS

FIG. 6A-6F are views showing the steps for manufacturing a printed circuit board in an embodiment of the present invention, wherein FIGS. 6B-6E are cross-sectional views and FIGS. 6A and 6F are plan views of the pad section after the plating process.

Figure 1:
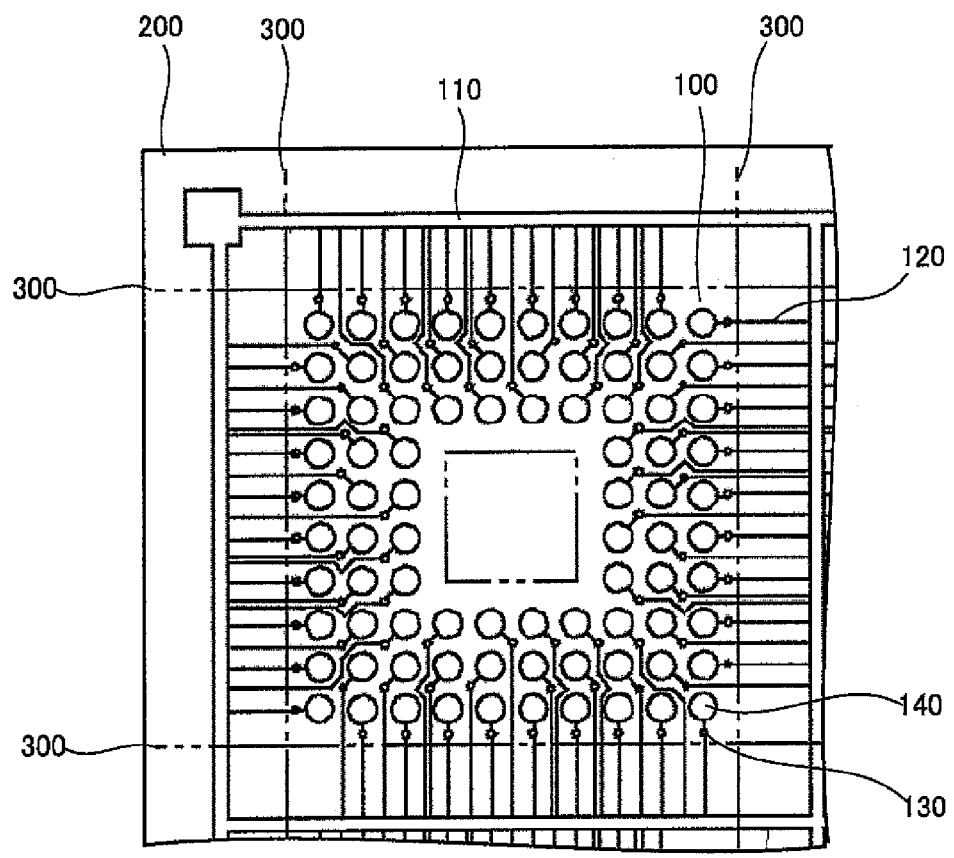
FIG. 1 is a plan view showing the configuration of a conventional printed circuit board.
Figure 2:
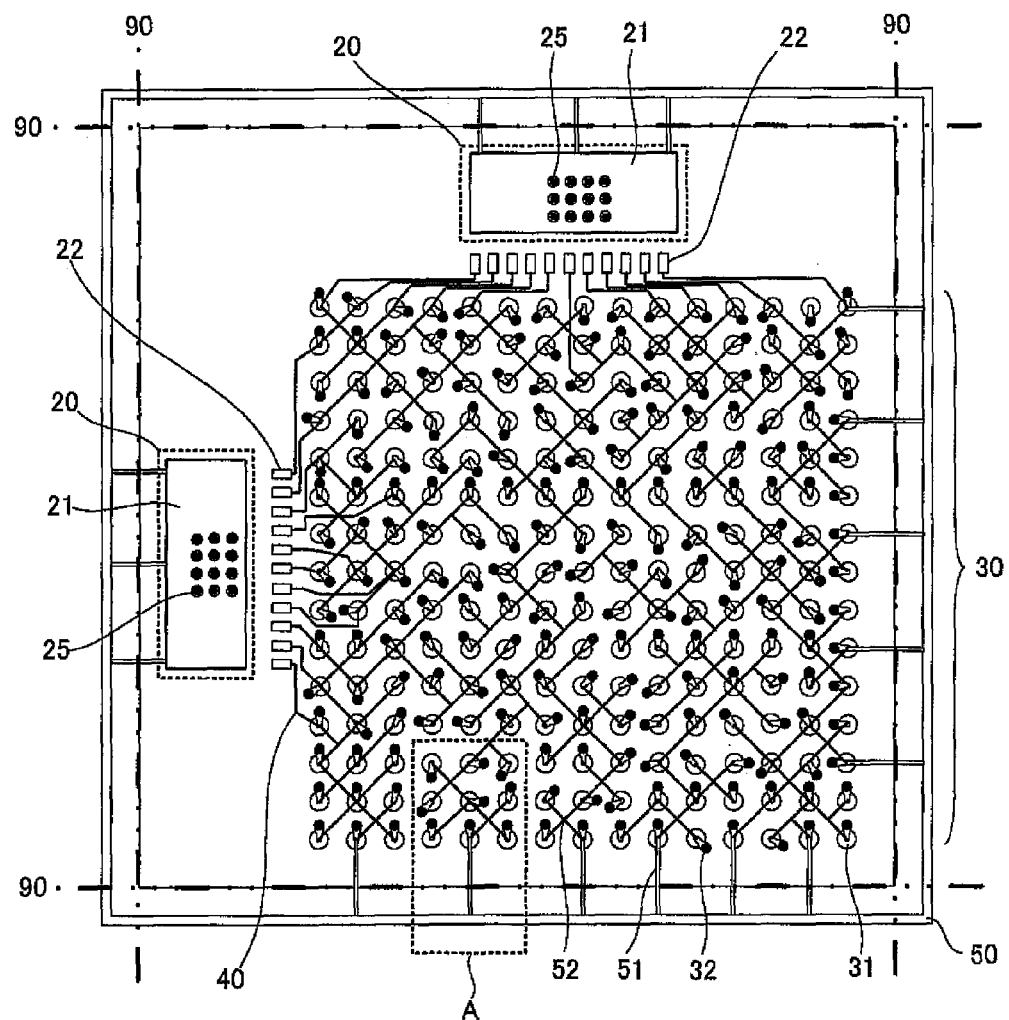
FIG. 2 is a plan view showing the configuration of the obverse surface of the printed circuit board in an embodiment of the present invention.
Figure 3:
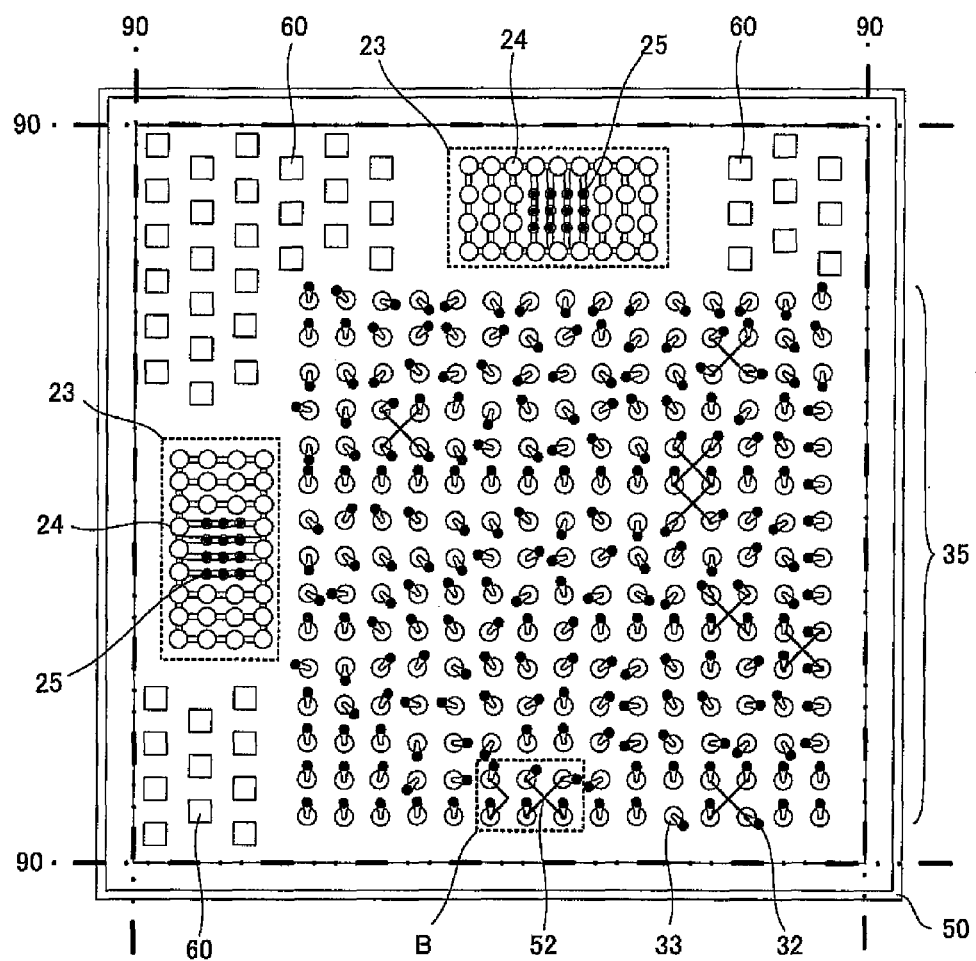
FIG. 3 is a plan view showing the configuration of the reverse surface of the printed circuit board in an embodiment of the present invention.
Figure 4:
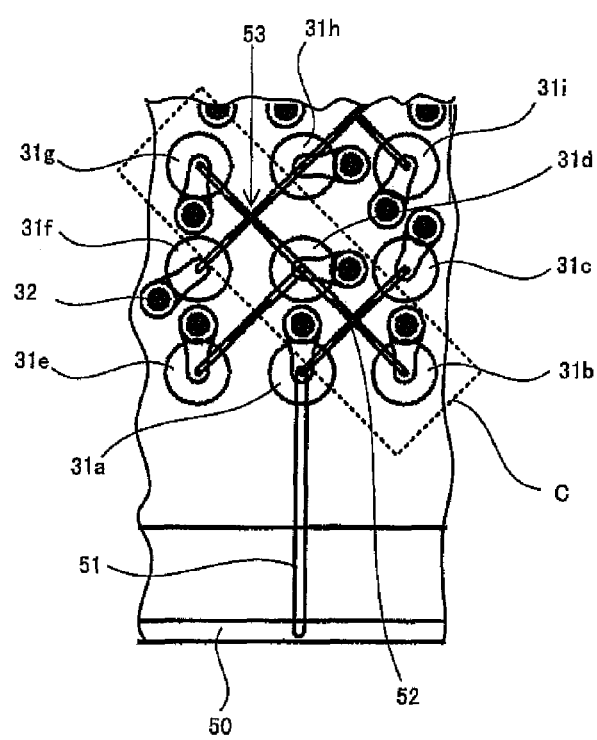
FIG. 4 is an enlarged view of the elements of a printed circuit board in an embodiment of the present invention.
Figure 5A:
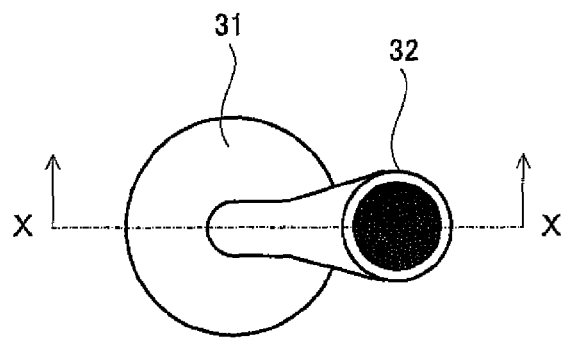
FIG. 5A is a plan view showing the configuration of a land pad.
Figure 5B:
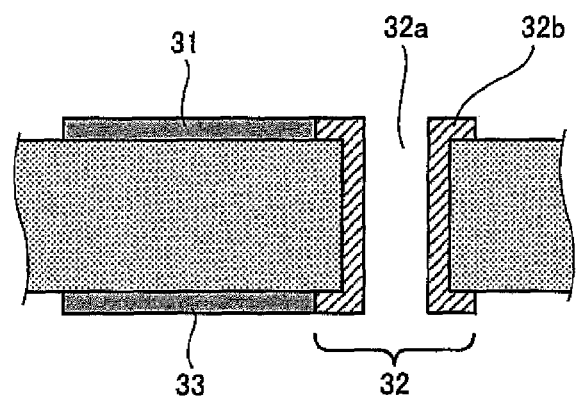
FIG. 5B is a cross-sectional view along line X-X in FIG. 5A.
Figure 6A:
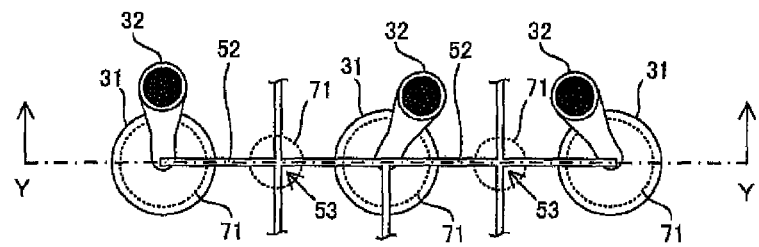
Figure 6B:
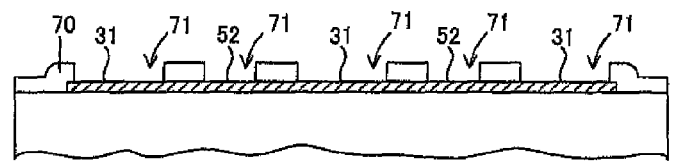
Figure 6C:
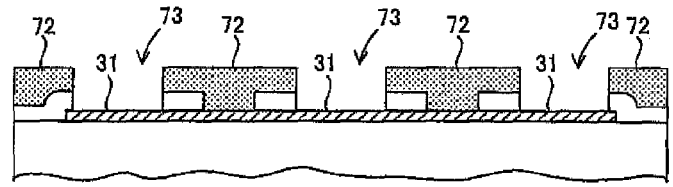
Figure 6D:
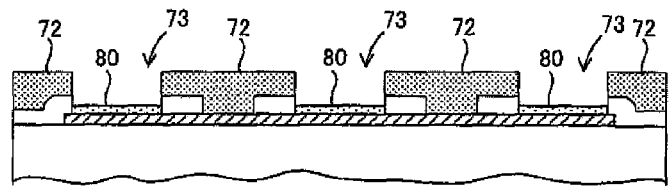
Figure 6E:
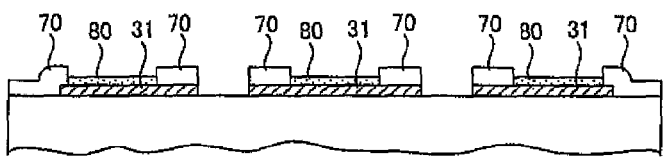
Figure 6F:
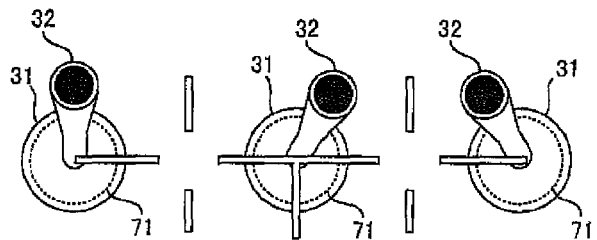
Figure 7:
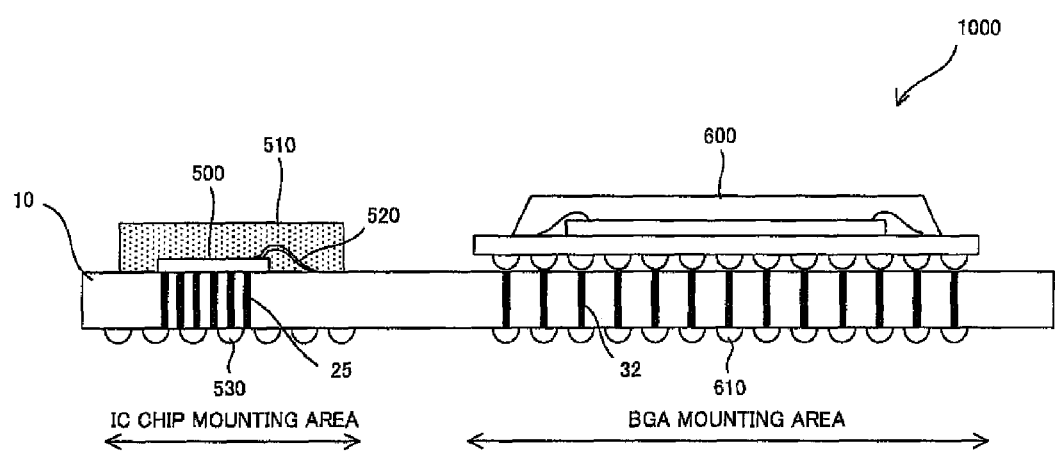
FIG. 7 is a cross-sectional view of a semiconductor device manufactured using the printed circuit board in an embodiment of the present invention.

This application is based on Japanese Application No. 2008-167152 (published Jun. 26, 2008), and the entire disclosed content thereof is incorporated herein by reference.

What is claimed is:

1. A method for manufacturing a printed circuit board having an insulative board and a plurality of electroconductive pads arranged in a grid shape on said insulative board, the method comprising:
a step for forming an electroconductive film on said insulative board;
a step for forming a pattern on said electroconductive film so as to form said electroconductive pads, a lead wire connected only to electroconductive pads positioned at an outermost periphery of the plurality of electroconductive pads arranged in the grid shape so that at least one electroconductive pad not connected to said lead wire is disposed between the electroconductive pads connected to said lead wire, and inter-pad wiring for electrically connecting each of the electroconductive pads not connected to said lead wire to any of the electroconductive pads connected to said lead wire, said inter-pad wiring being disposed between adjacent electroconductive pads in a diagonal direction with respect to vertical and horizontal directions of said grid shape, wherein said inter-pad wiring includes a linear section that connects at least three of said electroconductive pads aligned diagonally on said insulative board;
a step for plating each of said electroconductive pads by immersing said insulative board in a plating bath and energizing each of said electroconductive pads through said lead wire; and
a step for removing said inter-pad wiring.

2. The method for manufacturing a printed circuit board of claim 1, wherein said inter-pad wiring has a branching point at an intermediate point between the mutually adjacent electroconductive pads.

3. The method for manufacturing a printed circuit board of claim 2, wherein the step for removing said inter-pad wiring includes a step for etching said inter-pad wiring so as to include said branching point.

4. The method for manufacturing a printed circuit board of claim 1, wherein said electroconductive pads are formed on the both sides of said insulative board, and the electroconductive pads formed on one side are electrically connected by through-holes to the electroconductive pads formed on the other side.

5. The method for manufacturing a printed circuit board of claim 4, wherein said inter-pad wiring is formed on the both sides of said insulative board.

6. A method for plating a printed circuit board having an insulative board and a plurality of electroconductive pads arranged in a grid shape on said insulative board, in which each of said electroconductive pads of the printed circuit board undergoes a plating process, the method comprising:
a step for forming said electroconductive pads on said insulative board, a lead wire connected only to electroconductive pads positioned at an outermost periphery of the plurality of electroconductive pads arranged in the grid shape so that at least one electroconductive pad not connected to said lead wire is disposed between the electroconductive pads connected to said lead wire, and inter-pad wiring for electrically connecting each of the electroconductive pads not connected to said lead wire to any of the electroconductive pads connected to said lead wire, said inter-pad wiring having a branching point at an intermediate point between mutually adjacent electroconductive pads, wherein said inter-pad wiring includes a linear section that connects at least three of said electroconductive pads aligned diagonally on said insulative board;
a step for plating each of said electroconductive pads by immersing said insulative board in a plating bath and energizing each of said electroconductive pads through said lead wire; and
a step for removing said inter-pad wiring.

7. A method for manufacturing a semiconductor package having a printed circuit board that includes an insulative board and a plurality of electroconductive pads arranged in a grid shape on said insulative board, and a semiconductor device mounted on said printed circuit board, the method comprising:
a step for forming an electroconductive film on said insulative board;

a step for forming a pattern on said electroconductive film so as to form said electroconductive pads, a lead wire connected only to electroconductive pads positioned at an outermost periphery of the plurality of electroconductive pads arranged in the grid shape so that at least one electroconductive pad not connected to said lead wire is disposed between the electroconductive pads connected to said lead wire, and inter-pad wiring for electrically connecting each of the electroconductive pads not connected to the lead wire to any of the electroconductive pads connected to said lead wire, said inter-pad wiring being disposed between adjacent electroconductive pads in a diagonal direction with respect to vertical and horizontal directions of said grid shape, wherein said inter-pad wiring includes a linear section that connects at least three of said electroconductive pads aligned diagonally on said insulative board;

a step for plating each of said electroconductive pads by immersing said insulative board in a plating bath and energizing each of said electroconductive pads through said lead wire;

a step for removing said inter-pad wiring; and a step for mounting said semiconductor device on said printed circuit board and electrically connecting external connection terminals of said semiconductor device to each of said electroconductive pads.

8. The method for manufacturing a printed circuit board of claim 1, wherein the electroconductive pads connected to the lead wire are arranged at equidistant intervals along the outermost periphery of the plurality of electroconductive pads arranged in the grid shape.

9. The method of plating a printed circuit board of claim 6, wherein the electroconductive pads connected to the lead wire are arranged at equidistant intervals along the outermost periphery of the plurality of electroconductive pads arranged in the grid shape.

10. The method of plating a printed circuit board of claim 6, wherein the inter-pad wiring is disposed between adjacent electroconductive pads in a diagonal direction with respect to vertical and horizontal directions of the grid shape.

11. The method for manufacturing a semiconductor package of claim 7, wherein the electroconductive pads connected to the lead wire are arranged at equidistant intervals along the outermost periphery of the plurality of electroconductive pads arranged in the grid shape.

* * * * *